(12) United States Patent
Jurg et al.

(10) Patent No.: US 11,602,790 B2
(45) Date of Patent: Mar. 14, 2023

(54) METHOD AND SYSTEM FOR QUALITY ASSURANCE AND CONTROL OF ADDITIVE MANUFACTURING PROCESS

(71) Applicant: Monash University, Clayton (AU)

(72) Inventors: Marten Jurg, Clayton (AU); Andrey Molotnikov, Clayton (AU)

(73) Assignee: Monash University

(*) Notice: Subject to any disclaimer, the term of this patent is extended or adjusted under 35 U.S.C. 154(b) by 269 days.

(21) Appl. No.: 16/611,897

(22) PCT Filed: May 10, 2018

(86) PCT No.: PCT/AU2018/050434
§ 371 (c)(1),
(2) Date: Nov. 8, 2019

(87) PCT Pub. No.: WO2018/204981
PCT Pub. Date: Nov. 15, 2018

(65) Prior Publication Data
US 2021/0078076 A1    Mar. 18, 2021

(30) Foreign Application Priority Data

May 10, 2017   (AU) ................................ 2017901729

(51) Int. Cl.
*B22F 10/00*    (2021.01)
*B33Y 10/00*    (2015.01)
(Continued)

(52) U.S. Cl.
CPC ............. *B22F 10/00* (2021.01); *B33Y 10/00* (2014.12); *B22F 10/10* (2021.01);
(Continued)

(58) Field of Classification Search
None
See application file for complete search history.

(56) References Cited

U.S. PATENT DOCUMENTS 10,137,500 B2    11/2018   Blackmore
10,183,329 B2     1/2019   Gunther
(Continued)

FOREIGN PATENT DOCUMENTS

EP    2832474 A1    2/2015
EP    3162474 A1    5/2017
(Continued)

OTHER PUBLICATIONS

Hirsch et al., "Targeted rework strategies for powder bed additive manufacture", Additive Manufacturing, Jan. 2018, pp. 127-133, vol. 19.
(Continued)

*Primary Examiner* — Colin W. Slifka
(74) *Attorney, Agent, or Firm* — The Webb Law Firm (57) ABSTRACT

An additive manufacturing system and method is provided for fabricating 3D objects (16) from successive layers (14) of material. The additive manufacturing system (10) has an energy projection assembly (20) for inputting energy (22) into a specified area within the layer (18) to consolidate the material; a plurality of image sensors (30, 32, 34), each of the image sensors having a corresponding field of view (35, 40, 42) covering at least part of the layer (18) of material, such that each of the fields of view at least partially overlap with the field of view of at least one other of the image sensors; and an image processor (56) to capture image data from each of the image sensors (30, 32, 34). The image processor (56) controls exposure times for each of the image sensors (30, 32, 34) and combines the image data from the image sensors to provide a single, spatially resolved image of the energy being input throughout the specified area for each layer (14) of material respectively for comparison against threshold data values to locate potential consolidation defects in the specified area.

9 Claims, 6 Drawing Sheets

(51) Int. Cl.
*B33Y 30/00* (2015.01)
*B33Y 50/02* (2015.01)
*B29C 64/153* (2017.01)
*B29C 64/245* (2017.01)
*B29C 64/393* (2017.01)
*B22F 10/10* (2021.01)

(52) U.S. Cl.
CPC ......... *B22F 2998/10* (2013.01); *B29C 64/153* (2017.08); *B29C 64/245* (2017.08); *B29C 64/393* (2017.08); *B33Y 30/00* (2014.12); *B33Y 50/02* (2014.12)

(56) References Cited

U.S. PATENT DOCUMENTS

| | | | |
|---|---|---|---|
| 10,379,517 | B2 | 8/2019 | Shapiro et al. |
| 10,500,675 | B2 | 12/2019 | Cheverton et al. |
| 2013/0314504 | A1 | 11/2013 | Zenzinger et al. |
| 2014/0308153 | A1 | 10/2014 | Ljungblad |
| 2015/0165681 | A1 | 6/2015 | Fish |
| 2015/0165683 | A1 | 6/2015 | Cheverton et al. |
| 2016/0176114 | A1 | 6/2016 | Tsai et al. |
| 2016/0224017 | A1 | 8/2016 | Huang et al. |
| 2017/0120376 | A1 | 5/2017 | Cheverton et al. |
| 2020/0089185 | A1 | 3/2020 | Shapiro et al. |

FOREIGN PATENT DOCUMENTS

| | | |
|---|---|---|
| JP | 2016535690 A | 11/2016 |
| WO | 2007147221 A1 | 12/2007 |
| WO | 2016131018 A1 | 8/2016 |
| WO | 2016131022 A1 | 8/2016 |
| WO | 2016167793 A1 | 10/2016 |
| WO | 2016201390 A1 | 12/2016 |

OTHER PUBLICATIONS

"Image stitching—Wikipedia", Dec. 2015, Retrieved from the Internet: URL:https://en.wikipedia.org/w/index.php?title=Image stitching &oldid=693727653 [retrieved on Mar. 22, 2021].

Jhabvala et al., "On the effect of scanning strategies in the selective laser melting process", Virtual and Physical Prototyping, Jun. 2010, pp. 99-109, vol. 5:2.

Mireles et al., "Analysis and correction of defects within parts fabricated using powder bed fusion technology", Surface Topography: Metrology and Properties, Sep. 2015, pp. 1-13, vol. 3:3.

Wei et al., "Effects of the Processing Parameters on the Forming Quality of Stainless Steel Parts by Selective Laser Melting", Advanced Materials Research, 2011, pp. 3668-3671, vol. 189-193.

METHOD AND SYSTEM FOR QUALITY ASSURANCE AND CONTROL OF ADDITIVE MANUFACTURING PROCESS

CROSS-REFERENCE TO RELATED APPLICATIONS

This application is the United States national phase of International Application No. PCT/AU2018/050434 filed May 10, 2018, and claims priority to Australian Patent Application No. 2017901729 filed May 10, 2017, the disclosures of which are hereby incorporated by reference in their entirety.

FIELD OF THE INVENTION

The present invention relates to additive manufacturing of three dimensional objects by sequentially depositing and consolidating layers of the object. In particular, the invention relates to powder bed fusion (PBF) such as selective laser sintering (SLS), electron beam melting (EBM) and selective laser melting (SLM).

BACKGROUND OF THE INVENTION

Selective laser sintering (SLS), selective laser melting (SLM), electron beam melting (EBM) are types of powder bed fusion (PBF) manufacturing. Successive layers of a raw material in powder form are deposited and solidified in specified areas (corresponding to a layer of the three dimensional object) until the three dimensional object is complete. This allows the fabrication of objects with complex geometries that would not be possible using casting or molding techniques.

The specified areas of the powder material are sintered or melted using an applied energy source, such as a laser or electron beam. The precision and speed of a laser or electron beam allows relatively fast production of intricate three dimensional objects with fine tolerances. Usually, the computer controlled laser scans through the area of powder to be consolidated in a reciprocating raster pattern. SLS systems partially melt a fraction of the individual particles to fuse the powder while SLM and EBM processes completely melt the powder material at the point of energy input.

While powder bed fusion is of great interest to many industries, there can be build quality problems and a lack of process repeatability for newly designed components. Variations in the energy input can result in a lack of proper consolidation in the melt pool and a fusion defect in the 3D object. Similarly, variations in thermal characteristics across the layer of material (e.g. local heat conduction rates) can prevent proper fusion. These variations need to be identified and accounted for in the operating parameters of the energy source (e.g. the laser power, the laser spot size, the scanning velocity and so on).

In light of this, quality assurance systems have been developed such as that described in WO 2007/147221. This method captures images of the laser spot interaction with the powder material. Using the image data, the characteristics of the laser melt pool are maintained within acceptable tolerances through feedback control of the laser operating parameters. While these techniques effectively monitor the build process, the high sampling rate of the image sensors generates vast amounts of image data. This necessitates a control processor with enough power to process large volumes of image data being captured at high frame rates (many thousands of data points per second), and provide real time feedback control of the build process.

Systems such as that described in US2013/0314504 use an infrared (I) (wavelength <900 nm) detector to image the IR emissions of the consolidation and subsequent cooling. This can allow a lower frame rate for image capture and therefore generates less image data. A profile of the cooling of the consolidated powder layer is used to infer the build quality of each level. However, by monitoring the cooling characteristics of the solidified powder, there is already an inherent delay in feedback control to the laser.

Any reference herein to a patent document or other matter which is given as prior art is not to be taken as an admission that that document or matter was known or that the information it contains was part of the common general knowledge as at the priority date of any of the claims.

SUMMARY OF THE INVENTION

With the above issues in mind, one aspect of the present invention provides an additive manufacturing system for fabricating 3D objects from successive layers of material, the additive manufacturing system comprising:

an energy projection assembly for inputting energy into a specified area within the layer to consolidate the material;

a plurality of image sensors, each of the image sensors having a corresponding field of view covering at least part of the layer of material, such that each of the fields of view at least partially overlap with the field of view of at least one other of the image sensors; and, an image processor to capture image data from each of the image sensors; wherein during use;

the image processor controls exposure times for each of the image sensors and combines the image data from the image sensors to provide a single, spatially resolved image of the energy being input throughout the specified area for each layer of material respectively for comparison against threshold data values to locate potential consolidation defects in the specified area.

Throughout the description and claims of the specification, the word "comprise" and variations of the word, such as "comprising" and "comprises", is not intended to exclude other additives, components, integers or steps.

The additive manufacturing system of the present invention uses relatively long exposure times to capture a single image of the area being melted or sintered in that layer of powder. The overlapping image data from each of the relevant image sensors is combined to generate a single, spatially resolved image of the energy input at all points within the specified area. The pixel data from this single image is compared to a reference image and differences exceeding a predetermined variance are identified as potential defects in that layer of material. Each layer or 'slice' of the 3D object has a corresponding reference image and the single image generated from the image sensors is compared to the reference image for that slice.

Locating potential defects from a single image rather than a large set of images captured at high frame rates dramatically reduces the amount of data processing. This in turn reduces processing times such that real time feedback control of the fabrication process requires far less processing power. As discussed further below, multiple image sensors allow a scalable system with much higher image resolution than otherwise possible.

Capturing the consolidation of the material as the energy is input provides a more accurate indication of potential defects. In contrast, some known techniques (for example US 2013/314504 discussed above) capture the infrared emissions from the cooling material to infer the build quality of the part. This can involve exposure times of up to five seconds in order to provide adequate image contrast needed for processing. The long exposure times used in the present invention may also capture some image data immediately after consolidation. However, the relatively long exposure time is not for the purposes of creating image contrast but rather for data compression. Each pixel of the captured image has a luminosity value indicative of the visible radiation emitted during the energy input at that point. The overlapping fields of view ensure that the entire specified area is covered, but the control processor can switch between relevant image sensors to keep the exposure times short enough that background noise does not have a significant effect on the data captured. The control processor may simply divide up the specified area equally between each of the relevant image sensors or use some other technique for switching between sensors which takes into account the laser's raster pattern.

The use of multiple cameras allows increased image resolution of the image without resorting to expensive image sensors with large sensor arrays. The system is scalable in the sense that adding more image sensors extends the field of view. Furthermore, overlapping image data of the same sub-region, from different image sensors, is also useful for noise calibration. In contrast, single camera systems would need to use a wide angle lens, and/or a more elevated position to extend field of view. However, there are restrictions on the space surrounding powder bed fusion machines and wide angle lenses, or 'fish-eye' lenses, introduce detrimental image distortions and lower resolution.

The data captured by each image sensor is a spatially resolved image of the energy input in part of the specified area. When merged with the image data from the other image sensors, a single image with a relatively small amount of spatially resolved image data is indicative of the energy input across the whole area of interest within that layer of material. The comparison between this single image and a reference image requires little processing power and allows real-time feedback control of the laser or electron beam. Smaller data volumes are more easily stored, or used to develop a 3D defect map of the component.

According to another aspect, the present invention provides a method of fabricating a three dimensional object by additive manufacturing, the method comprising the steps of:
providing a layer of material in an unconsolidated form in a build chamber;
consolidating the material in a specified area of the layer using an energy projection assembly;
capturing a plurality of images of the specified area using a plurality of image sensors, each of the image sensors having a corresponding field of view covering at least part of the layer of material, and at least partially overlapping with the field of view of at least one other of the image sensors;
setting exposure times for image capture such that image data from the image sensors collectively provides a single, spatially resolved image of the specified area as energy is input to the material by the energy projection assembly; and,
comparing the image data from the single, spatially resolved image against threshold data values to locate potential consolidation defects in the specified area.

Preferably, the exposure times are staggered and at least partially overlapping with each other. Preferably, the energy projection assembly has at least one scanning laser head configured to scan a laser beam across the layer of material in the work bed in a reciprocating raster pattern, the control processor being configured to confine the raster pattern to the area of interest for that layer. However, the invention may also be used in a stereo lithography system, digital light projection system, or a masked energy source projection system in which the entire area of interest is simultaneously exposed to an energy beam of corresponding shape.

In some embodiments of the invention, the image data from the single, spatially resolved image is resolved into scan vectors with associated intensity values corresponding to individual laser tracks followed the laser scan head. Assessing the energy input level along each scan track detects defects while also providing more process information than a straight forward comparison of the image data to reference data.

In a particularly preferred form, the material is a powdered metal. In other forms, the material is a powdered polymer, ceramic or liquid polymer.

Preferably the image sensors are CCD (charge-coupled device) arrays, CMOS (complementary metal oxide semiconductor) arrays, or sCMOS (scientific-CMOS) arrays.

Preferably, the image processor is configured to selectively activate and deactivate the image sensors when the point of energy input is within areas of overlap between the corresponding fields of view.

Optionally, the energy projection assembly is configured deactivate between successive layers for a predetermined deactivation period, and the image processor is configured to activate and deactivate the image sensors to capture the single spatially resolved image within a capture period that is less than half the predetermined deactivation period such that the image processor is able to detect the end of the energy input process for each of the successive layers.

In some embodiments, the additive manufacturing system further comprises a build chamber for housing a build platform to support the layer of material, the build chamber having one or more viewing windows for observing the build process wherein the image sensors are mounted outside the build chamber and view the build platform through one or more of the viewing windows.

Optionally, the image sensors are positioned to view the layer of material on the build platform at an angle inclined to the normal of the layer, and the image processor is configured to manipulate the image data from each of the image sensors to correct for perspective. This is well suited to retro-fitting the system to existing PBF equipment where the image sensors will need to 'see' through the viewing window(s) on the side of the build chamber.

Preferably, the image sensors are positioned directly above the layer of material such that their optical axes are normal to the layer. In this case, the system is integrated into the PBF equipment during assembly. Being directly above the power layer reduces the need to correct for perspective.

Preferably the image processor is configured to use the image data for the single, spatially resolved image of the specified area for feedback control of the energy projection assembly.

Preferably the additive manufacturing system is a selective laser sintering (SLS) system, a selective laser melting (SLM) system or an electron beam system and the image sensors are configured to record light emissions from molten material at a point of energy input scanning across the area of interest in the layer. The skilled worker will understand that the term 'light' refers to electro-magnetic radiation including infra-red, visible and ultra violet light.

In a related aspect of the invention, there is provided an additive manufacturing system for fabricating 3D objects from successive layers of material, the additive manufacturing system comprising:

an energy projection assembly for inputting energy into a specified area within the layer to consolidate the material;

a processor configured to receive data indicative of energy input to the material and thereby identify regions of the specified area having insufficient energy input as defect regions not meeting a predetermined quality metric; wherein, the processor operatively controls the energy projection assembly to selectively apply energy to the defect regions.

Preferably, the processor is further configured to vary input power to the energy projection assembly to adjust the energy input to the material.

Preferably the energy selectively applied to the defect regions is controlled by the processor to provide the material with a customised microstructure.

Preferably customised microstructure differs from the microstructure of the material in the remainder of the specified area.

In some embodiments, the energy projection assembly has a scanning energy beam (such as a laser or electron beam) and the processor is configured to selectively control one or more of the following process parameters during the application of energy to the defect regions:

scan speed;
scan acceleration;
scan direction;
hatch distance (being the spacing between adjacent scan tracks);
offset distance (being the difference, if any, between the laser scanned area and the defect region);
beam focus (altering the size of the energy input spot); and
beam input power modulation.

Optionally, the processor selects one or more of the following beam scan patterns during the application of energy to the defect regions:

directional rastering (in which beam scan tracks extend back and forth in a regular hatching style pattern), nested contour loops (in which the beam path is a contour-wise, nested rastering of discrete loops corresponding to the defect region shape) and, spiral winding (in which the beam path is a contour-wise, nested rastering of continuous loops corresponding to the defect region shape).

Optionally, the processor is configured to divide the defect region into a number of sub-regions and applies the energy to each of the sub-regions using different process parameters.

Optionally, the processor is configured to apply the energy to the defect region if the defect region is sufficiently proximate defect regions detected in a previous layer of the material. Preferably, and the processor is configured to control one or more of the process parameters during the energy input such that consolidation occurs in the defect region of the previous layer.

Preferably, the processor is configured to detect excess energy input into the specified area and adjust the process parameters for inputting energy into a specified area of a subsequent layer of the material.

Preferably, the processor is configured to access a database with the process parameters used during previous corrections of consolidation defects, and use information from the database to select the process parameters for the application of energy to the defect region.

Preferably, a plurality of like additive manufacturing systems record process parameter data into the database.

Preferably, the processor is configured to generate a record of build quality for each of the fabricated 3D objects in a two-dimensional slice form, or three-dimensional volume form, showing locations of the defect regions.

Preferably, the processor is further configured to use information from the database to automatically identify regions with higher propensity for defects from recorded defects in previously built components or particular structures, and pre-emptively vary the process parameters to avoid defect formation.

BRIEF DESCRIPTION OF THE DRAWINGS

The invention will now be described by way of example only with reference to preferred embodiments shown in the accompanying drawings, in which.

DETAILED DESCRIPTION OF THE PREFERRED EMBODIMENTS

Figure 1:
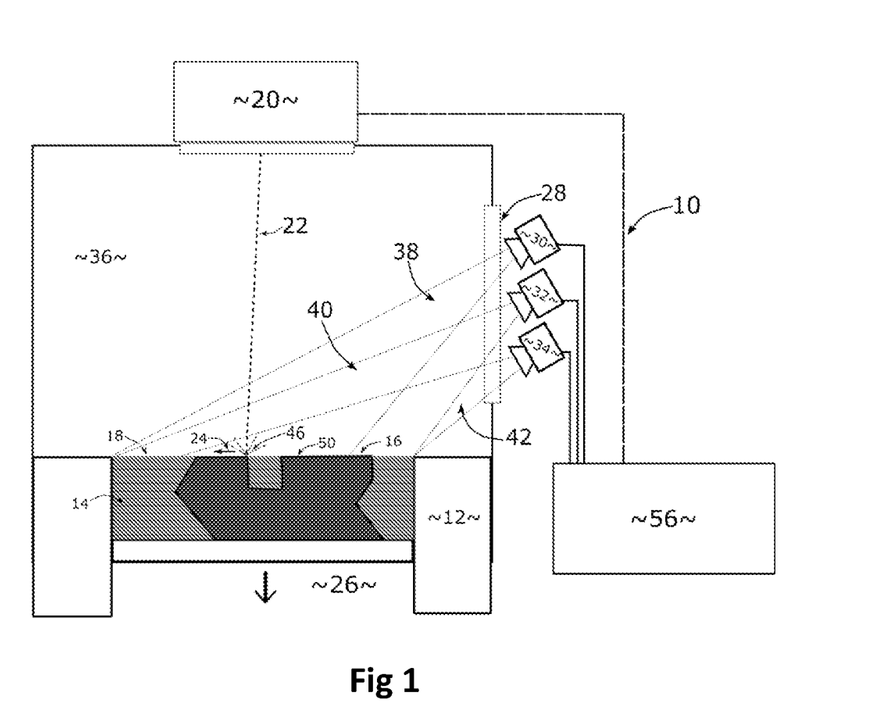
FIG. 1 is a schematic representation of an additive manufacturing system according to the present invention.

Referring to FIG. 1, the selective laser melting system 10 progressively builds a three dimensional component 16 layer by layer from solidifying selected areas of powder material sequentially deposited in layers 14 movable build platform 12 within a build chamber 36. Build chamber 36 has a viewing window 28 (typically a semitransparent laser safe window) for safely observing the build process.

The top most layer 18 of powdered material is exposed to a laser beam 22 from a scanning laser head 20. A laser beam 22 scans across the powder layer 18 in the direction indicated by arrow 24 in a predetermined raster pattern. A laser melt pool 46 forms where the laser beam 22 is incident with the powdered material. The melt pool 46 travels with the laser beam 22 as it scans through the raster pattern leaving behind melted material to cool and solidify. Once the predetermined raster pattern has been completed, a fresh layer of powdered material is deposited as the floor 26 of the build platform 12 indexes downwards by the thickness of the new layer.

A processor 56 controls three image sensors 30, 32 and 34 positioned outside the chamber 36 to view the build process through the window 28. The processor 56 may also operate the scanning laser head 20, or the scanning laser head may be separately controlled. Using the same controller, or linking the separate controllers allows real time feedback control of the build process. Each of the image sensors 30, 32 and 34 has a corresponding field of view 38, 40 and 42 respectively. In combination, the respective fields of view cover the top most layer 18 of the build chamber 36. However, each field of view overlaps with at least one adjacent field of view. As the scanning laser head 20 scans across the specified area of interest in the top layer 18, each of the image sensors 30, 32 and 34 capture image data of the laser melt pool 46 as it moves through the corresponding fields of view 38, 40 and 42. In the overlap 50 between the field of view 38 and the field of view 40, the laser melt pool 46 may be captured by both the image sensors 30 and 32. This will capture two sets of image data for some parts of the overlap, and the processor 56 can reduce this to a single set by simply discarding one set, or use both sets of image data to reduce noise in the pixel data.

Alternatively, the processor 56 selects some point within the overlap to deactivate one image sensor and activate the next, particularly if it is necessary to apportion the exposure time such that none of the sensors are exposed long enough that background noise adversely affects the image data.

Filters (e.g. neutral density (ND) filter) may be used to reduce the incident light to the image sensors. In other cases, a bandpass filter is used to capture selected wavelengths such as 600-900 nm (red to near-I) to improve image quality.

Once the scanning laser head 20 has completed the predetermined raster pattern for the top most layer 18, the image data from each of the image sensors 30, 32 and 34 is merged by the control processor 56 into a single image by discarding or amalgamating the dual image data captured in the areas of overlap.

A single, spatially resolved image per layer (or specified area) will typically have between 10 kilobytes and 20 Megabytes of data, although there may be more image data depending on the part size, the number of image sensors and selected imaging resolution. However, to illustrate the data reduction relative to existing techniques, image data of 10 kilobytes to 20 megabytes translates to a sampling rate ranging from 10-1 to 10-4 Hz. This in turn allows for conventional high resolution cameras to be used and significantly faster real-time processing.

Figure 2A:
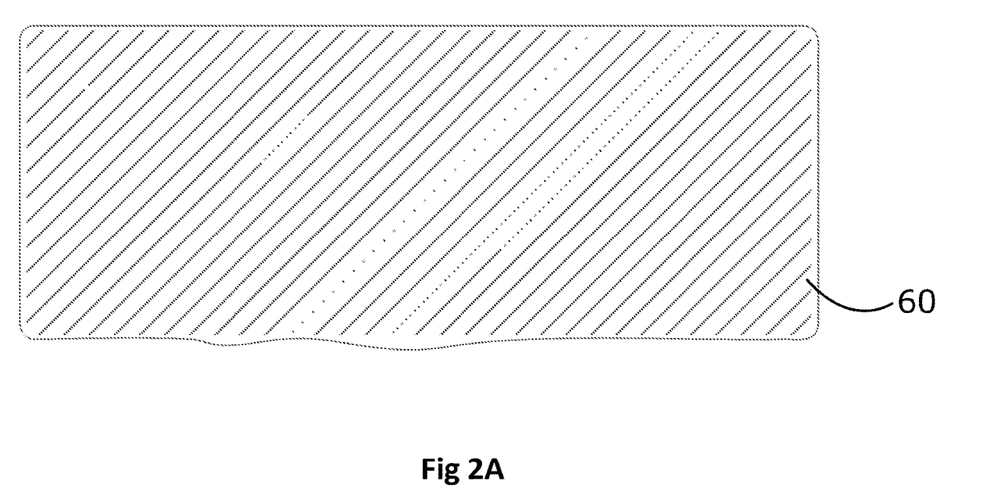
FIG. 2A shows a single image captured within the build area of an SLM additive manufacturing system.
Figure 2B:
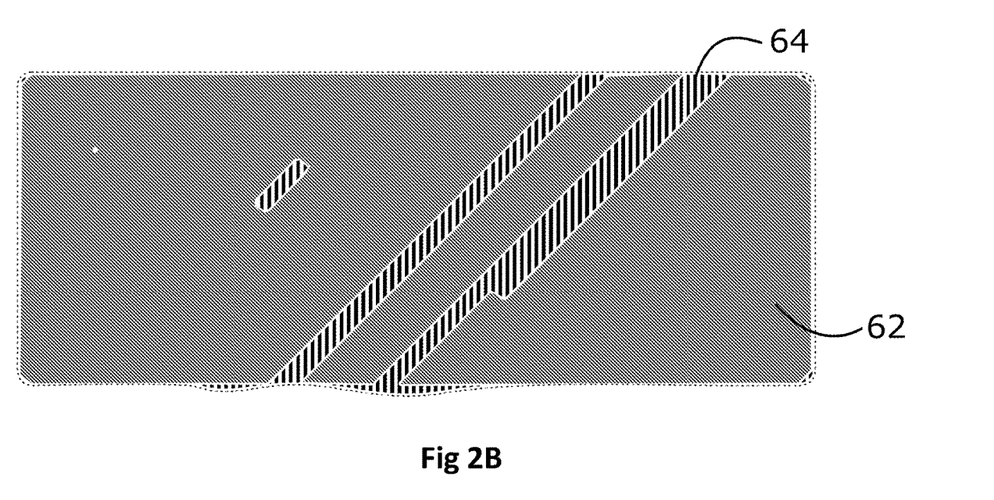
FIG. 2B shows the image data manipulated by the control processor to provide a spatially resolved indication of the defects within the build area.

Referring to FIG. 2A, a single, spatially resolved image 60 of a build layer, or specified area within a larger build layer is shown. The raster direction of the scanning laser head is indicated by the striations in the image. The processor 56 calibrates this image against a stored reference image (not shown) to generate the potential defect map of FIG. 2B. Here the pixel data 62 within an acceptable variation of the reference pixel data is shown in clear contrast to the pixel data 64 beyond the set variance from the reference image. The areas 64 provide an indication of potential defects in the consolidation of the powdered material. Combining successive layers creates a three dimensional representation of the size, distribution and location of defects across the entire build.

The system is may be retro-fitted to existing PBF machines, and can be implemented as a feedback control system, or a stand-alone quality monitoring device.

The laser or electron beam scan tracks across the powder are captured as image pixel data with the luminosity levels being indicative of the input energy and the material emissivity (incandescence, I or UV radiation) with variance due to changes in focal position and material/energy interactions (i.e. reflectivity/absorption).

Following capture, the processor adjusts the image to maximise the contrast range before applying intensity and wavelength thresholds. Through the application of image thresholding with an appropriate intensity or wavelength based on the material being processed, differences relative to the reference image in the emitted energy indicate the presence of a defect or variance in applied energy or scan pattern. The method allows for the detection of input energy variance, which may be an underlying effect of a machine fault or process variance (intentional or otherwise), ranging from micron to entire bed sized faults or discrepancies.

Process variance, including uneven distribution of powder over a layer, depressions or rises in part geometry, or melt instabilities (such as balling) create a change in light intensity produced during the melting process. Process variances such as these appear as change in light intensity and wavelength relative to a calibrated reference, and flagged as a potential defect. The map of process defects is useful for assessing the quality of a produced part, or in development of a new process parameter or geometry.

The process is repeated for each layer of interest in the build, after which the layer threshold images are combined to create a three-dimensional representation of the built geometry, similar to the reconstruction of computer tomography data (CT). The process operator is instantly notified of any anomalies detected (email, SMS, display device etc.), and/or a change in the machine state is implemented. This may involve simply halting the build process to allow for operator intervention, re-scanning the defective layer, or enacting a pre-set response function altering the machine process parameters.

The invention can be applied using various imaging systems, with multiple types of optics in many configurations. The apparatus may have controllable exposure digital imaging devices in the ultraviolet, visible or infrared spectrum (or any combination thereof), focusable optics, a rigid fixed frame, and an image processing computer. Furthermore, the system may also contain a number of optical filters, perspective shifting optical device, and a monitor for data review.

In cases where the powder bed is relatively large, additional cameras can be employed to cover the entire build area, or provide greater resolution across the build area or in localised regions of concern. In laser scanning systems with multiple scan heads, this method can be employed to verify the alignment of the scan pattern on the produced part.

Figure 3A:
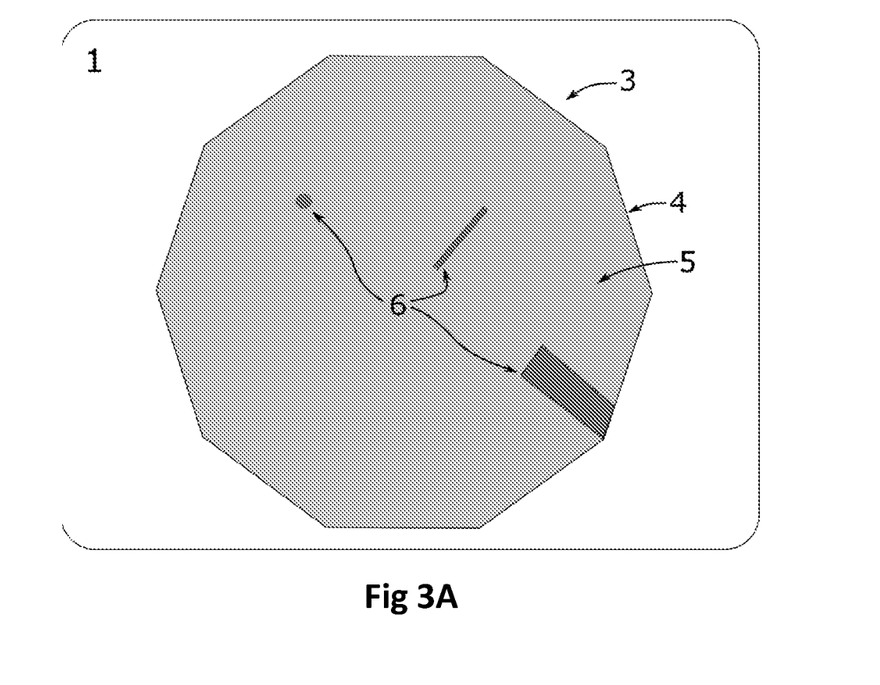
FIG. 3A is a schematic representation of a single spatially resolved image from one layer of the 3D object exposed to the energy projection assembly through a mask.
Figure 3B:
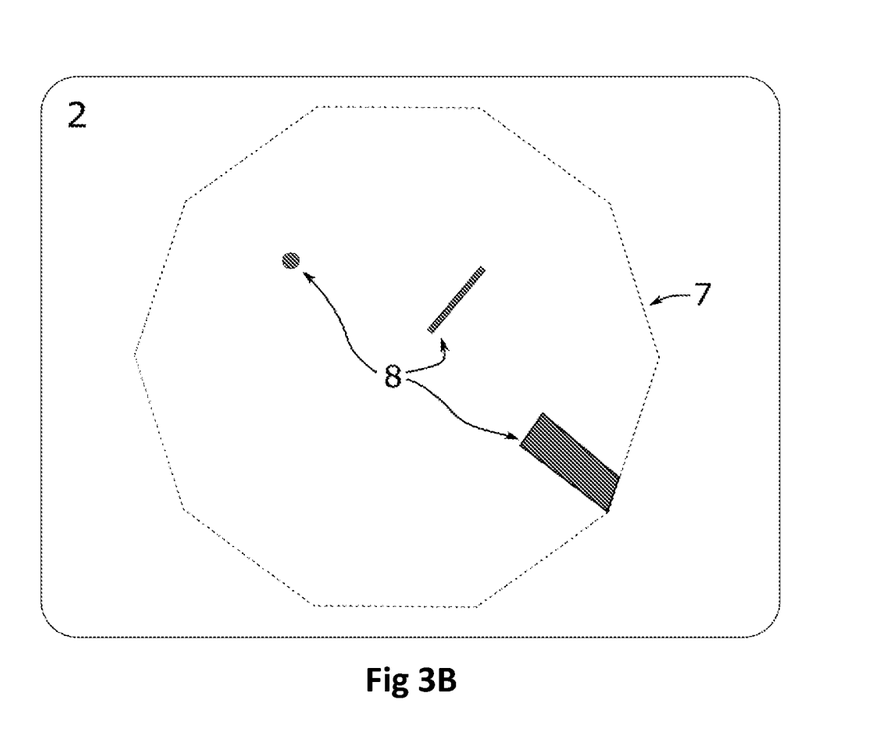
FIG. 3B is a schematic representation of a new mask for the layer shown in FIG. 3A to re-expose areas identified as potential defects

Referring to FIGS. 3A and 3B, a feedback control system for a PBF system is illustrated. The single spatially resolved image 1 for one layer 3 of a 3D component indicates the specified area 4 of the powdered material to be consolidated by an energy projection assembly. Within the specified area 4, the image 1 indicates sufficient consolidation of the majority of the powder 5. However, the image 1 also includes defect areas 6 in which the image data excessively differs from predetermined reference or calibration data.

Having identified potential defect areas 6, the controller (not shown) generates a second exposure mask or raster pattern 8 within the original exposure mark or raster pattern 7. The powdered material within the new mask or raster pattern 8 is re-exposed to the energy projection assembly to properly consolidate the powder and remove the defects 6 from the spatially resolved image of the re-exposed layer.

Figure 4A:
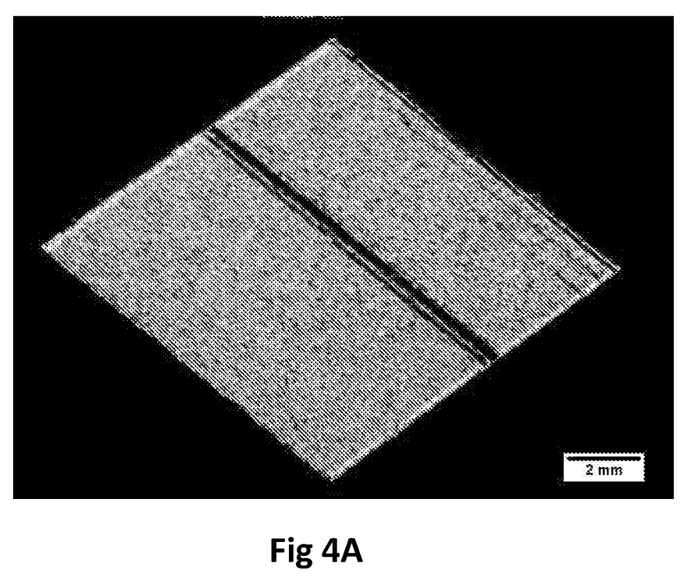
FIG. 4A shows another spatially resolved image from one layer of a different 3D object exposed to the energy projection assembly.
Figure 4B:
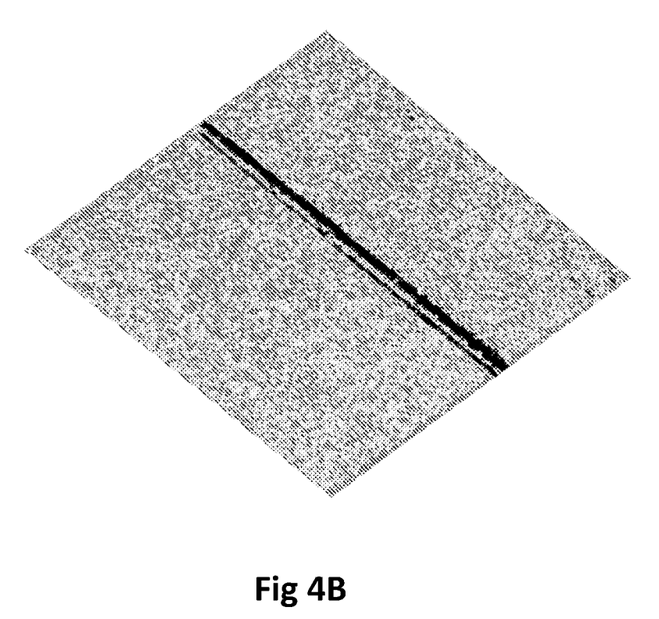
FIG. 4B shows a light intensity map generated from the pixel data in the image of FIG. 4A.
Figure 5:
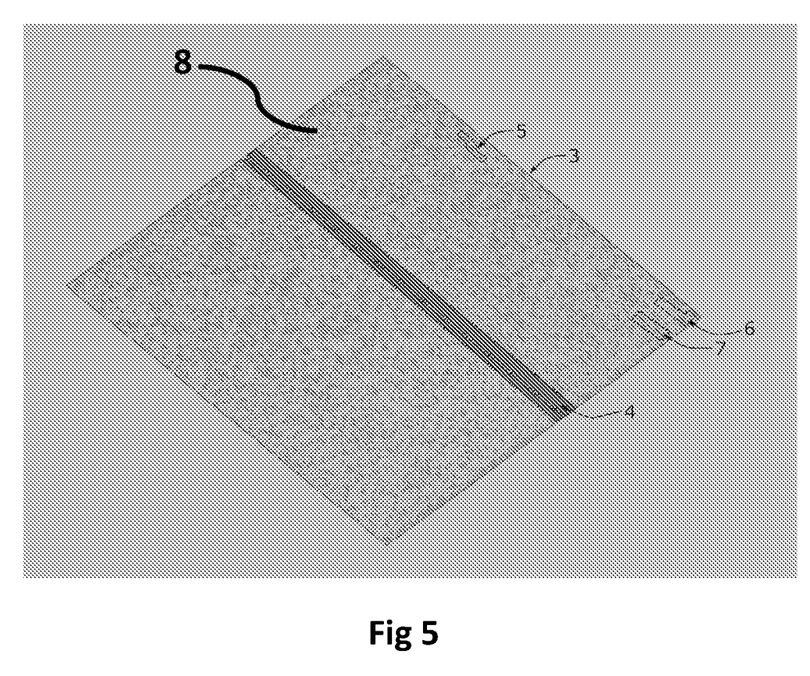
FIG. 5 shows the light intensity map of FIG. 4B with defect regions indicated; and, FIG. 6A is an enlargement of an identified defect region.

Only the material within the second exposure mask 8 is re-exposed so that the correctly consolidated material 5 is not affected. Furthermore, the scanning parameters for the re-exposure of the defects 6 can be altered, most likely to a lower power setting, to avoid over-melting material that has already been exposed to the energy projection assembly. It will be appreciated that control and modification of the scan parameters allows greater control of the component microstructure within arbitrarily selected areas. This allows for customisation and variation of material properties across each layer of the component. FIGS. 4A, 4B, 5 and 6A to 6D, illustrate the stages of identifying and repairing defects in one layer of a 3D object. FIG. 4A shows the image captured of the scan layer after exposure to the laser. The luminosity values of the pixel data is used to generate the light intensity map shown in FIG. 4B. The light intensity map is compared to the reference image data for that scan level to identify any potential defects as shown in FIG. 5. Within the 3D part contour boundary 3, is a broad scale defect 4 extending across the scanned area. Smaller defects 5, 6 and 7 are located at towards one edge of the layer.

Figure 6A:
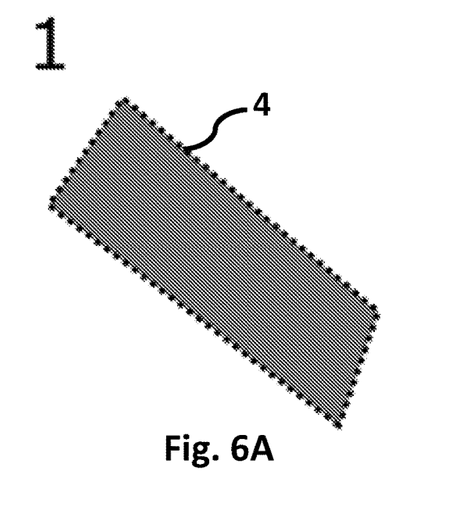
Figure 6B:
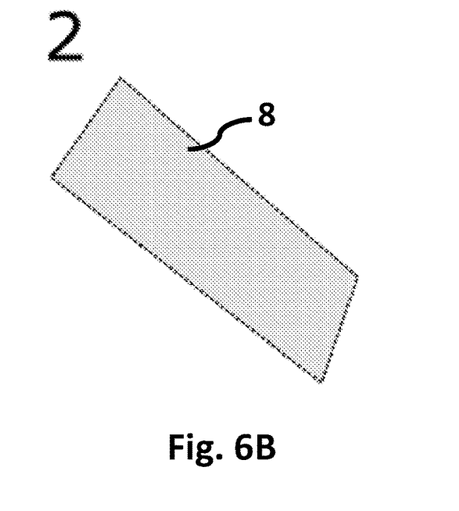
FIG. 6B is the layer mask created for the defect region of FIG. 6A; and, FIGS. 6C and 6D shows different laser scan patterns that may be used within the defect region.
Figure 6C:
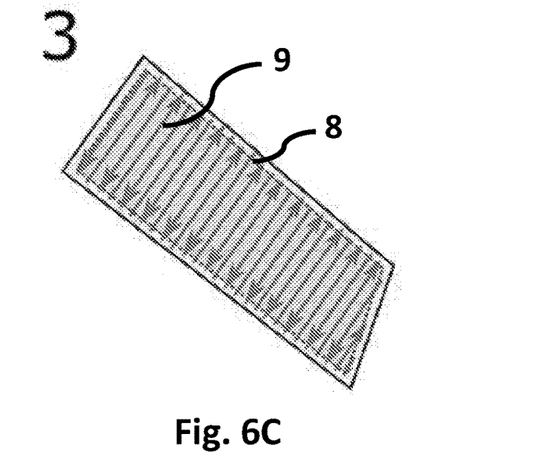
Figure 6D:
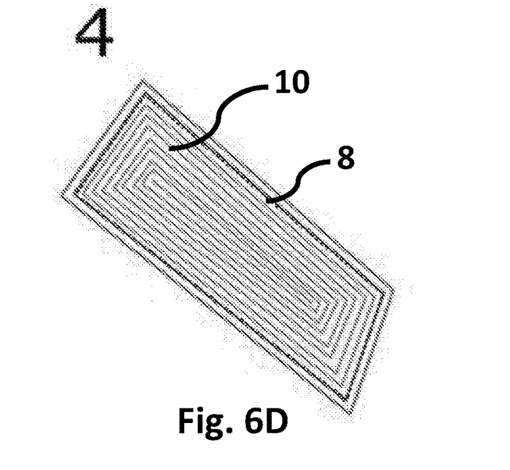

When a defect in a scan layer has been identified, an intervening step may be taken to repair the defect. With the layer exposure complete, but prior to powder recoating, a new layer mask 8 covering the defect region 4 is generated. In some specific cases, the defect is a surface depression and powder recoating will occur before defect repair to fill the depressed area. Appropriate laser scan parameters are selected, and transferred to the control processor to be enacted. While being repaired the imaging device and processor assesses the effect of the repair scans and records details of the enacted repair in the build log for later review. When complete, the normal build process resumes with powder re-coating for the next layer of the 3D part. The system may be configured to allow the type and extent of repair strategy to be selected with a variety of processing options. This includes the type of intervention, being: monitor and record only, monitor and report on defects detected larger than a set threshold, monitor and pause the build process on a detected defect larger than a set threshold, monitor and enact repair strategy for defects larger than a set threshold, or any combination of these strategies. The threshold value can be set on the size of the defect area, relative light intensity, deviation in energy input path outside of the predefined region of interest, occurrence of a particular defect type (as discussed earlier), or any combination of these values each with upper and lower bounds.

Where the user has selected to enact a feedback strategy, there are number of options for defect repair. Such options include: repair type, input power, scan speed, hatch distance, offset distance, change in focus level (altering the size of the energy input spot), direction of scan, acceleration controls or constant velocity scan passes, and input power modulation in various scan regions. Options for repair type include length-wise rastering 9 (see FIG. 6C) wherein the input energy beam moves back and forth in a regular hatching style pattern, spiral type winding 10 (see FIG. 6D) of the input energy path, contour-wise rastering wherein the input energy beam creates discrete loops around the defect shape 8 offset to fill the designated defect area, or any combination of the above. Small, isolated spot defects (e.g. defect 6 shown in FIG. 3A) may be less than 300 microns in diameter. In this case, the repair protocol would only require a small polygon, spiral raster or even a point input for a period ensuring the melt pool encompasses the defect. Depending on the size and aspect ratio of the identified defect a series of polygons, spirals or points could be used in conjunction to reconsolidate the defect.

The region of repair, once a defect 8 has been detected can be selected to be larger, smaller or the same size as the true defect size 4, and can be separated into any number of discrete regions wherein repair strategies are individually selected and enacted. In this manner the microstructure of suitable alloy systems may be modified in localised regions to yield improved properties, such as damage behaviour, strength, or ductility, to compensate for the defect. Depending on the alloy system in use, altered properties can be achieved by altering the power and dwell time of the energy input source.

The presence of a small defect in one particular layer may not be of consequence, as the scan parameters may be such that the region is remelted in the subsequent layers. In this case, the system monitors whether defects have been detected in an overlapping or adjacent region for more than a predetermined number of layers (e.g. 2 or 3), in which case a repair strategy is enacted. In this instance a larger energy input will likely be selected to consolidate the layers below.

Regions of excess energy input or part deformation may be detected by an increase in the light intensity of a particular region. In this case a second repair scan would be undesirable, and as such a different approach can be applied. Upon detection of excess energy input, the system modifies scan strategy of the subsequent layer of the build file to reduce energy input in a localised region for that particular layer. The number of layers that can be subsequently reduced in power is variable, along with the other scan parameters for each of the subsequent layers.

More sophisticated versions of the feedback system operate autonomously by the use of a machine learning algorithm to determine the feedback strategy, based on a set of previously enacted responses (i.e. a learning set). The machine learning set is developed by tracking the user responses across a number of machines and users, networked to a common database.

The system logs the location of any defective or repaired regions as a record of the build quality in either two-dimensional slice form, or three-dimensional volume view. Such information allows the operator to improve the design or detect machine issues requiring maintenance or repair. The log and build images can be retained for a permanent record of part conformance, or future diagnostic assessment.

The build log and learning set are also used to automatically identify regions with higher propensity for defects. Recorded defects in previously built components or particular structures (e.g. inclined surfaces, particular angles, thicknesses etc.) within components will have an associated log of the defect correction. If the same or similar components and structures are identified in the current build, the processor pre-emptively varies the process parameters to avoid defect formation.

Various aspects and features of the invention will now be broadly described:

An additive manufacturing system for fabricating 3D objects from successive layers of material, the additive manufacturing system comprising:

an energy projection assembly for inputting energy into a specified area within the layer to consolidate the material;

a plurality of image sensors, each of the image sensors having a corresponding field of view covering at least part of the layer of material, such that each of the fields of view at least partially overlap with the field of view of at least one other of the image sensors; and, an image processor to capture image data from each of the image sensors; wherein during use;

the image processor controls exposure times for each of the image sensors and combines the image data from the image sensors to provide a single, spatially resolved image of the energy being input throughout the specified area for each layer of material respectively for comparison against threshold data values to locate potential consolidation defects in the specified area.

An additive manufacturing system according to the above wherein the exposure times are staggered and at least partially overlapping with each other.

An additive manufacturing system according to the above wherein the energy projection assembly has at least one scanning laser head or scanning electron beam configured to scan across the layer of material in the build chamber in a reciprocating raster pattern, the control processor being configured to confine the raster pattern to the area of interest for that layer.

An additive manufacturing system according to the above wherein the image data from the single, spatially resolved image is resolved into scan vectors with associated intensity values corresponding to individual laser tracks followed the laser scan head.

An additive manufacturing system according to the above wherein the powdered material is a powdered metal, powdered polymer, powdered ceramic, or combination thereof.

An additive manufacturing system according to the above wherein the image sensors are CCD (charge-coupled device) arrays, CMOS (complementary metal oxide semiconductor) arrays, or sCMOS (scientific-CMOS) arrays.

An additive manufacturing system according to the above wherein the image processor is configured to selectively activate and deactivate the image sensors when the point of energy input is within areas of overlap between the corresponding fields of view.

An additive manufacturing system according to the above wherein the energy projection assembly is configured deactivate between successive layers for a predetermined deactivation period, and the image processor is configured to activate and deactivate the image sensors to capture the single spatially resolved image within a capture period that is less than half the predetermined deactivation period such that the image processor is able to detect the end of the energy input process for each of the successive layers.

An additive manufacturing system according to the above further comprising a build chamber for housing a build platform to support the layer of material, the build chamber having one or more viewing windows for observing the build process wherein the image sensors are mounted outside the build chamber and view the build platform through one or more of the viewing windows.

An additive manufacturing system according to the above wherein the image sensors are positioned to view the layer of material on the build platform at an angle inclined to the normal of the layer, and the image processor is configured to manipulate the image data from each of the image sensors to correct for perspective.

An additive manufacturing system according to the above wherein the image sensors are positioned directly above the layer of material such that their optical axes are normal to the layer.

An additive manufacturing system according to the above wherein the image processor is configured to use the image data for the single, spatially resolved image of the specified area for feedback control of the energy projection assembly.

An additive manufacturing system according to the above wherein the system is a selective laser sintering (SLS) system, a selective laser melting (SLM) system, or a laser powder bed fusion (L-PBF) system and the image sensors are configured to record light emissions from molten material at a point of energy input scanning across the area of interest in the layer.

An additive manufacturing system according to the above wherein the system is an electron beam melting system.

An additive manufacturing system according to the above wherein the system is a masked energy projection system, in which the entire area of interest is simultaneously exposed to an energy beam of corresponding shape.

An additive manufacturing system according to the above wherein the system is a stereolithography (STL) system or a digital light projection (DLP) system.

A method of fabricating a three dimensional object by additive manufacturing, the method comprising the steps of:

providing a layer of material in an unconsolidated form in a build chamber;

consolidating the material in a specified area of the layer using an energy projection assembly;

capturing a plurality of images of the specified area using a plurality of image sensors, each of the image sensors having a corresponding field of view covering at least part of the layer of material, and at least partially overlapping with the field of view of at least one other of the image sensors;

setting exposure times for image capture such that image data from the image sensors collectively provides a single, spatially resolved image of the specified area as energy is input to the material by the energy projection assembly; and, comparing the image data from the single, spatially resolved image against threshold data values to locate potential consolidation defects in the specified area.

A method according to the above wherein the energy projection assembly has at least one scanning laser head or scanning electron beam configured to scan across the layer of material in the build chamber in a reciprocating raster pattern confined to the area of interest for that layer.

A method according to the above further comprising resolving the image data from the single, spatially resolved image into scan vectors with associated intensity values corresponding to individual laser tracks followed the laser scan head.

A method according to the above wherein the powdered material is a powdered metal, powdered polymer, powdered ceramic, or combination thereof.

A method according to the above wherein the image sensors are CCD (charge-coupled device) arrays, CMOS (complementary metal oxide semiconductor) arrays, or sCMOS (scientific-CMOS) arrays.

A method according to the above wherein the image sensors are selectively activated and deactivated when the point of energy input is within areas of overlap between the fields of view corresponding to each of the image sensors respectively.

A method according to the above wherein the energy projection assembly is deactivated between successive layers for a predetermined deactivation period, and the image sensors are activated and deactivated to capture the single spatially resolved image within a capture period that is less than half the predetermined deactivation period in order to detect the end of the energy input process for each of the successive layers.

A method according to the above wherein the layer of material is supported on a build platform housed in a build chamber, the build chamber having one or more viewing windows for observing the build process and the image sensors are mounted outside the build chamber to view the build platform through one or more of the viewing windows.

A method according to the above wherein the image sensors are positioned to view the layer of material on the build platform at an angle inclined to the normal of the layer, and the image processor is configured to manipulate the image data from each of the image sensors to correct for perspective.

A method according to the above wherein the image sensors are positioned directly above the layer of material such that their optical axes are normal to the layer.

A method according to the above wherein the image data for the single, spatially resolved image of the specified area is used for feedback control of the energy projection assembly.

A method according to the above implemented by a processor to operate a selective laser sintering (SLS) system, or a selective laser melting (SLM) system wherein the image sensors are configured to record light emissions from molten material at a point of energy input scanning across the area of interest in the layer.

A method according to the above implemented by a processor to operate an electron beam melting system.

A method according to the above implemented by a processor to operate a masked energy projection system, in which the entire area of interest is simultaneously exposed to an energy beam of corresponding shape.

A method according to the above implemented by a processor to operate a stereolithography (STL) system or a digital light projection (DLP) system.

An additive manufacturing system for fabricating 3D objects from successive layers of material, the additive manufacturing system comprising:
an energy projection assembly for inputting energy into a specified area within the layer to consolidate the material;
a processor configured to receive data indicative of energy input to the material and thereby identify regions of the specified area having insufficient energy input as defect regions not meeting a predetermined quality metric; wherein,
the processor operatively controls the energy projection assembly to selectively apply energy to the defect regions.

An additive manufacturing system according to the above wherein the processor is further configured to vary input power to the energy projection assembly to adjust the energy input to the material.

An additive manufacturing system according to the above wherein the energy selectively applied to the defect regions is controlled by the processor to provide the material with a customised microstructure.

An additive manufacturing system according to the above wherein the customised microstructure differs from the microstructure of the material in the remainder of the specified area.

An additive manufacturing system according to the above wherein the energy projection assembly has a scanning energy beam and the processor is configured to selectively control one or more of the following process parameters during the application of energy to the defect regions:
scan speed;
scan acceleration;
scan direction;
hatch distance being the spacing between adjacent scan tracks;
offset distance being a difference, if any, between an area scanned by the energy beam and the defect region;
beam focus in which the energy beam input spot size is altered; and
beam input power modulation to alter the energy beam power.

An additive manufacturing system according to the above wherein the processor selects one or more of the following scan patterns during the application of energy to the defect regions:
directional rastering in which energy beam scan tracks extend back and forth in a regular hatching style pattern;
point exposure in which the energy beam is held at a fixed location proximate the defect region for a specified period of time;
nested contour loops in which the energy beam path is a contour-wise, nested rastering of discrete loops corresponding to the defect region shape; and,
spiral winding in which the energy beam path is a contour-wise, nested rastering of continuous loops corresponding to the defect region shape.

An additive manufacturing system according to the above wherein the processor is configured to divide the defect region into a number of sub-regions and applies the energy to each of the sub-regions using different process parameters.

An additive manufacturing system according to the above wherein the processor is configured to apply the energy to the defect region if the defect region is sufficiently proximate defect regions detected in at least one previous layer of the material.

An additive manufacturing system according to the above wherein the processor is configured to control one or more of the process parameters during the energy input such that consolidation occurs in the previous layer as well.

An additive manufacturing system according to the above wherein the processor is configured to detect excess energy input into the specified area and adjust process parameters for inputting energy into a specified area of a subsequent layer of the material.

An additive manufacturing system according to the above wherein the processor is configured to access a database with the process parameters used during previous corrections of consolidation defects, and use information from the database to select the process parameters for the application of energy to the defect region.

An additive manufacturing system according to the above wherein a plurality of like additive manufacturing systems record process parameter data into the database.

An additive manufacturing system according to the above wherein the processor is configured to generate a record of build quality for each of the fabricated 3D objects in a two-dimensional slice form, or three-dimensional volume form, showing locations of the defect regions.

An additive manufacturing system according to the above wherein the processor is further configured to use information from the database to automatically identify regions with higher propensity for defects from recorded defects in previously built components or particular structures, and pre-emptively vary the process parameters to avoid defect formation.

The invention has been described herein by way of example only. Skilled workers in this field will readily recognise many variations and modification that do not depart from the spirit and scope of the broad inventive concept.

The invention claimed is:

1. An additive manufacturing system for fabricating 3D objects from successive layers of material, the additive manufacturing system comprising:
   an energy projection assembly for inputting energy into a specified area within the layer to consolidate the material;
   a plurality of image sensors, each of the image sensors having a corresponding field of view covering at least part of the layer of material, such that each of the fields of view at least partially overlap with the field of view of at least one other of the image sensors; and
   an image processor to capture image data from each of the image sensors, wherein during use:
   the image processor controls exposure times for each of the image sensors such that the exposure times are staggered and partially overlapping with each other, and the image processor combines the image data from the image sensors to provide a single, spatially resolved image of the energy being input throughout the specified area for each layer of material respectively for comparison against threshold data values to locate potential consolidation defects in the specified area.

2. An additive manufacturing system according to claim 1 wherein the image data from the single, spatially resolved image is resolved into scan vectors with associated intensity values corresponding to individual laser tracks followed the laser scan head.

3. An additive manufacturing system according to claim 1 wherein the image sensors are CCD (charge-coupled device) arrays, CMOS (complementary metal oxide semiconductor) arrays, or sCMOS (scientific-CMOS) arrays.

4. An additive manufacturing system according to claim 1 wherein the image processor is configured to selectively activate and deactivate the image sensors when the point of energy input is within areas of overlap between the corresponding fields of view.

5. An additive manufacturing system according to claim 1 wherein the energy projection assembly is configured to deactivate between successive layers for a predetermined deactivation period, and the image processor is configured to activate and deactivate the image sensors to capture the single spatially resolved image within a capture period that is less than half the predetermined deactivation period such that the image processor is able to detect the end of the energy input process for each of the successive layers.

6. An additive manufacturing system according to claim 1 further comprising a build chamber for housing a build platform to support the layer of material, the build chamber having one or more viewing windows for observing the build process wherein the image sensors are mounted outside the build chamber and view the build platform through one or more of the viewing windows.

7. An additive manufacturing system according to claim 6 wherein the image sensors are positioned to view the layer of material on the build platform at an angle inclined to the normal of the layer, and the image processor is configured to manipulate the image data from each of the image sensors to correct for perspective.

8. An additive manufacturing system according to claim 1 wherein the image processor is configured to use the image data for the single, spatially resolved image of the specified area for feedback control of the energy projection assembly.

9. An additive manufacturing system according to claim 1 wherein the system is a selective laser sintering (SLS) system, a selective laser melting (SLM) system, or a laser powder bed fusion (L-PBF) system and the image sensors are configured to record light emissions from molten material at a point of energy input scanning across the area of interest in the layer.

* * * * *

UNITED STATES PATENT AND TRADEMARK OFFICE
CERTIFICATE OF CORRECTION

| | |
|---|---|
| PATENT NO. | : 11,602,790 B2 |
| APPLICATION NO. | : 16/611897 |
| DATED | : March 14, 2023 |
| INVENTOR(S) | : Marten Jurg et al. |

It is certified that error appears in the above-identified patent and that said Letters Patent is hereby corrected as shown below:

On the Title Page

Column 1, Assignee, Line 1, after "University" insert -- (AU) --

Signed and Sealed this
Sixteenth Day of May, 2023

Katherine Kelly Vidal
*Director of the United States Patent and Trademark Office*